United States Patent
Ganster et al.

(10) Patent No.: US 7,905,000 B2
(45) Date of Patent: Mar. 15, 2011

(54) PIEZOCERAMIC MULTILAYER ACTUATOR AND METHOD FOR THE PRODUCTION THEREOF

(75) Inventors: Axel Ganster, Schwindegg (DE); Susanne Kornely, München (DE); Andreas Lenk, Bannewitz Ot Possendorf (DE); Andreas Mantovan, Regenstauf (DE); Carsten Schuh, Baldham (DE); Jörg Zapf, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/524,549

(22) PCT Filed: Jan. 15, 2008

(86) PCT No.: PCT/EP2008/050403
§ 371 (c)(1),
(2), (4) Date: Jul. 24, 2009

(87) PCT Pub. No.: WO2008/092740
PCT Pub. Date: Aug. 7, 2008

(65) Prior Publication Data
US 2009/0320255 A1 Dec. 31, 2009

(30) Foreign Application Priority Data
Jan. 31, 2007 (DE) .................. 10 2007 004 813

(51) Int. Cl.
*H04R 17/00* (2006.01)
(52) U.S. Cl. ............. 29/25.35; 29/830; 29/831; 29/846; 29/851

(58) Field of Classification Search ................. 29/25.35, 29/830, 831, 846, 851
See application file for complete search history.

(56) References Cited

U.S. PATENT DOCUMENTS

| | | | |
|---|---|---|---|
| 4,988,909 A * | 1/1991 | Hagimura et al. | 310/358 |
| 5,191,688 A | 3/1993 | Kawai et al. | |
| 5,252,883 A | 10/1993 | Kondo | |
| 5,254,212 A * | 10/1993 | Someji et al. | 216/20 |
| 5,568,679 A * | 10/1996 | Ohya et al. | 29/25.35 |
| 5,680,685 A * | 10/1997 | Bischoff | 29/25.42 |
| 6,230,378 B1 * | 5/2001 | Cramer et al. | 29/25.35 |
| 6,384,517 B1 * | 5/2002 | Kojima et al. | 310/358 |
| 6,891,313 B1 * | 5/2005 | Henneken et al. | 310/328 |
| 7,309,397 B2 * | 12/2007 | Schreiner et al. | 156/89.12 |

(Continued)

FOREIGN PATENT DOCUMENTS

DE 4224284 A1 1/1993

(Continued)

OTHER PUBLICATIONS

International PCT Search Report excerpt, PCT/EP2008/050403, 2 pages, Mailed Jul. 21, 2008.

*Primary Examiner* — Derris H Banks
*Assistant Examiner* — Azm Parvez
(74) *Attorney, Agent, or Firm* — King & Spalding L.L.P.

(57) ABSTRACT

According to various production methods for producing a piezoceramic multilayer actuator, in the course of the production method, multilayer locks (10) are electrochemically or mechanically processed in such a way that a recess structure is obtained. The lateral surfaces (22; 24) of the electrodes (20) inside these recesses are electrically insulated using the slip casting method in order to be able to contact the remaining electrodes by imprinting an outer metallization.

6 Claims, 5 Drawing Sheets

U.S. PATENT DOCUMENTS

| | | | |
|---|---|---|---|
| 7,309,945 B2 * | 12/2007 | Iwase et al. | 310/328 |
| 7,633,210 B2 * | 12/2009 | Ono et al. | 310/328 |
| 7,797,804 B2 * | 9/2010 | Nakamura et al. | 29/25.35 |
| 2004/0178701 A1 * | 9/2004 | Sato et al. | 310/328 |

FOREIGN PATENT DOCUMENTS

| | | |
|---|---|---|
| DE | 4410504 A1 | 9/1994 |
| DE | 10021919 A1 | 8/2001 |
| DE | 102004012033 A1 | 10/2004 |
| DE | 102005008363 A1 | 8/2006 |
| DE | 102006001656 A1 | 2/2007 |
| EP | 1206804 B1 | 6/2006 |
| JP | 1184968 A | 7/1989 |
| JP | 5267743 A | 10/1993 |
| WO | WO 2005075113 A1 | 8/2005 |

\* cited by examiner

PIEZOCERAMIC MULTILAYER ACTUATOR AND METHOD FOR THE PRODUCTION THEREOF

CROSS-REFERENCE TO RELATED APPLICATIONS

This application is a U.S. National Stage Application of International Application No. PCT/EP2008/050403 filed Jan. 15, 2008, which designates the United States of America, and claims priority to German Application No. 10 2007 004 813.2 filed Jan. 31, 2007, the contents of which are hereby incorporated by reference in their entirety.

TECHNICAL FIELD

The present invention relates to a piezoceramic multilayer actuator and different methods for the production thereof.

BACKGROUND

Based on the piezoelectric effect, piezoelectric ceramics having a suitable crystal structure can expand or contract internally when an electric field is generated. This longitudinal change takes place virtually without delay relative to the controlling electric signal and furthermore is precisely controllable. For that reason piezoelectric multilayer actuators are used as final control elements.

Since the controlling electric field strength in such multilayer actuators lies in the range of several kV/mm, but moderate drive voltages are desired when the multilayer actuators are deployed in practice, the piezoceramic multilayer actuators are produced with layer thicknesses in the range of 100 µm. Typical production methods are slip casting or dry pressing. The individual ceramic layers are metallized and stacked one on top of another so that internal electrodes of opposite polarity disposed between two ceramic layers can generate the piezoelectric effect. All the internal electrodes of the same electric potential are electrically driven in alternation via an outer metallization parallel to the stacking direction or, as the case may be, longitudinal axis of the piezoceramic multilayer actuator. In order to ensure that the internal electrodes of opposite electric potential in each case are not shorted, these are arranged offset in relation to the other electrodes in the area of the outer metallization of the internal electrodes of opposite potential in each case. Due to design factors, piezoelectrically inactive zones are created as a result of this layer structure within the piezoceramic multilayer actuator. Because the piezoceramic multilayer actuator only expands or contracts in length in piezoelectrically active zones, since the internal electrodes of different polarity are arranged directly on top of one another in these zones, mechanical stresses occur inside the multilayer actuator in the transition region to piezoelectrically inactive zones. Said mechanical stresses resulted in the formation of cracks in the layer structure of the multilayer actuator which adversely affect the electrical contact of the outer metallization to the individual electrodes or can even lead to the total failure of the multilayer actuator. The problem of crack formation is reduced by the use of fully active piezoelectric multilayer actuators. No piezoelectrically inactive or passive zones are present in said fully active piezoelectric multilayer actuators, because the internal electrodes of both electric potentials extend on all sides over the entire cross-section of the multilayer actuator as far as the edge of the latter.

EP 1 206 804 B1 discloses a production method for piezoelectric multilayer actuators. Electrically conductive materials are deposited electrochemically on the lateral surfaces of the electrodes of the same polarity on the individual multilayer structures. Said materials form bridges which are electrically connected with one another after the lateral surfaces of the electrodes arranged between said bridges have been insulated.

DE 42 24 284 A1 discloses the production of a multilayer bar and its subsequent sintering as a preliminary stage for the production of piezoceramic multilayer actuators. A bar of said kind has for example the depth vertically and the length parallel to its stacking direction in accordance with a subsequent multilayer actuator. Its width vertically to the stacking direction is a multiple of a subsequent width of a piezoceramic multilayer actuator. After the sintering, the electrode structure of the individual piezoceramic multilayer actuators is created jointly on the multilayer bar and subsequently the latter is split into individual multilayer actuators. In order to produce the electrode structure, electrochemically conducting material is deposited on the lateral surfaces of every second electrode. The intermediate regions, i.e. ceramic and electrode, are set back into the sintered multilayer bar by etching or mechanical removal. These operations are complex and time-consuming, since the sintered multilayer bar is resistant to mechanical and chemical attack. An insulation layer is subsequently applied in the set-back regions and external electrodes are created for each subsequent multilayer actuator. Finally the sintered multilayer bar is subdivided into individual piezoceramic multilayer actuators.

U.S. Pat. No. 5,568,679 and WO 2005/075113 A1 also describe the creation of structured external electrodes on an already sintered multilayer preform body. An electrically insulating material is electrochemically deposited on each internal electrode of the same polarity such that the lateral surfaces of said electrodes are insulated toward the exterior. An electrically conductive material which interconnects the still exposed lateral surfaces of the electrodes of the other polarity is subsequently applied to the exteriors. Finally the sintered multilayer bar with structured electrode is split into individual piezoceramic multilayer actuators.

SUMMARY

According to various embodiments, production methods for a piezoceramic multilayer actuator can be provided which can be implemented with little overhead and consequently also at lower cost compared to conventional methods. According to other embodiments, a piezoceramic multilayer actuator can be provided which can correspondingly be produced more economically.

According to an embodiment, a production method for a piezoceramic multilayer actuator may have the following steps: a) Production of a multilayer bar as a green body consisting of an alternating arrangement of a plurality of piezoceramic layers and a plurality of electrodes in a stacking direction of the multilayer bar, while a depth of the multilayer bar vertically to the stacking direction corresponds to a depth of a multilayer actuator and a width of the multilayer bar vertically to the stacking direction corresponds to a width of a plurality of multilayer actuators and the electrodes extend over the entire depth of the multilayer bar and in alternation starting at opposite front faces of the multilayer bar over not the full width of the multilayer bar, b) arrangement of opposite auxiliary electrodes on the front faces spaced apart around the width of the multilayer bar such that every second electrode can be electrically driven in each case with the opposite auxiliary electrodes offset by one electrode in the stacking direction, c) electrochemical setting-back parallel to the depth of the multilayer bar, in particular etching, of a lateral surface of every second electrode such that on opposite wide sides of the multilayer bar every second lateral surface of the electrodes in each case is set back into the multilayer bar and the set-back lateral surfaces of the electrodes are spaced apart from one another by one piezoceramic layer on opposite wide sides of the multilayer bar in the stacking direction, d) coating of the set-back lateral surfaces of the electrodes with an electrically insulating layer and application in each case of a plurality of external electrodes on the opposite wide sides of the multilayer bar parallel to the stacking direction, e) sintering and separation of the multilayer bar parallel to its depth and stacking direction into a plurality of piezoceramic multilayer actuators.

According to a further embodiment, the set-back lateral surfaces of the electrodes may be in each case arranged in a recess which are filled and burned out for coating with an electrically insulating layer made of a ceramic or vitreous slip casting. According to a further embodiment, the plurality of external electrodes can be imprinted on the opposite wide sides of the multilayer bar. According to a further embodiment, the front faces with the auxiliary electrodes can be split off in such a way that no piezoelectrically inactive zones remain in the multilayer bar. According to a further embodiment, the sintering can be performed after steps c) and d).

According to another embodiments, a production method for a piezoceramic multilayer actuator may have the following steps: a) Production of a multilayer bar as a green body consisting of an alternating arrangement of a plurality of piezoceramic layers and a plurality of electrodes in a stacking direction of the multilayer bar, while a depth of the multilayer bar vertically to the stacking direction corresponds to a depth of a multilayer actuator and a width of the multilayer bar vertically to the stacking direction corresponds to a width of a plurality of multilayer actuators and the electrodes extend over the entire depth of the multilayer bar and in alternation starting at opposite front faces of the multilayer bar over not the full width of the multilayer bar, b) arrangement of opposite auxiliary electrodes on the front faces spaced apart around the width of the multilayer bar such that every second electrode can be electrically driven in each case with the opposite auxiliary electrodes offset by one electrode in the stacking direction, c) electrochemical deposition of electrically conductive material on a lateral surface of every second electrode such that every second lateral surface of the electrodes projects from the multilayer bar on opposite wide sides of the multilayer bar in each case, the projecting lateral surfaces of the electrodes are spaced apart from one another by one piezoceramic layer on opposite wide sides of the multilayer bar in the stacking direction, and recesses are formed between the projecting lateral surfaces of the electrodes, d) filling-out of the recesses with a ceramic or vitreous slip casting such that an electrically insulating coating with expansion properties adapted to the piezoceramic layer can be produced from the slip casting, e) application in each case of a plurality of external electrodes on the opposite wide sides of the multilayer bar parallel to the stacking direction, f) sintering and separation of the multilayer bar parallel to its depth and stacking direction into a plurality of piezoceramic multilayer actuators.

According to a further embodiment, the sintering can be performed after steps c) and d).

According to yet another embodiments, a production method for a piezoceramic multilayer actuator may have the following steps: a) Production of a multilayer bar as a green body consisting of an alternating arrangement of a plurality of piezoceramic layers and a plurality of electrodes in a stacking direction of the multilayer bar, while a depth of the multilayer bar vertically to the stacking direction corresponds to a depth of a multilayer actuator and a width of the multilayer bar vertically to the stacking direction corresponds to a width of a plurality of multilayer actuators and the electrodes extend over the entire depth of the multilayer bar, or production of a piezoelectrically fully active stack consisting of an alternating arrangement of a plurality of piezoceramic layers and a plurality of electrodes in a stacking direction, b) removal of a lateral surface of every second electrode in each case parallel to the depth direction of the multilayer bar by means of sawing, grinding, lasing, eroding and/or shaping, such that every second lateral surface of the electrodes in each case is set back into the multilayer bar on opposite wide sides of the multilayer bar and the set-back lateral surfaces of the electrodes are spaced apart from one another by one piezoceramic layer on opposite wide sides of the multilayer bar in the stacking direction, c) coating of the set-back lateral surfaces of the electrodes with an electrically insulating layer and application of a plurality of external electrodes in each case on the opposite wide sides of the multilayer bar parallel to the stacking direction, d) sintering and separating of the multilayer bar parallel to its depth and stacking direction into a plurality of piezoceramic multilayer actuators.

According to a further embodiment, the mechanical setting-back can be performed in a direction parallel or at an angle to the course of the lateral surfaces of the electrodes on the wide sides of the multilayer bar. According to a further embodiment, the sintering of the multilayer bar or stack may be performed before or after steps b) and c).

According to yet other embodiments, piezoceramic multilayer actuators can be produced using one of the production method described above.

BRIEF DESCRIPTION OF THE DRAWINGS

The present invention is described in more detail below with reference to the accompanying drawing, in which.

DETAILED DESCRIPTION

Figure 1A:
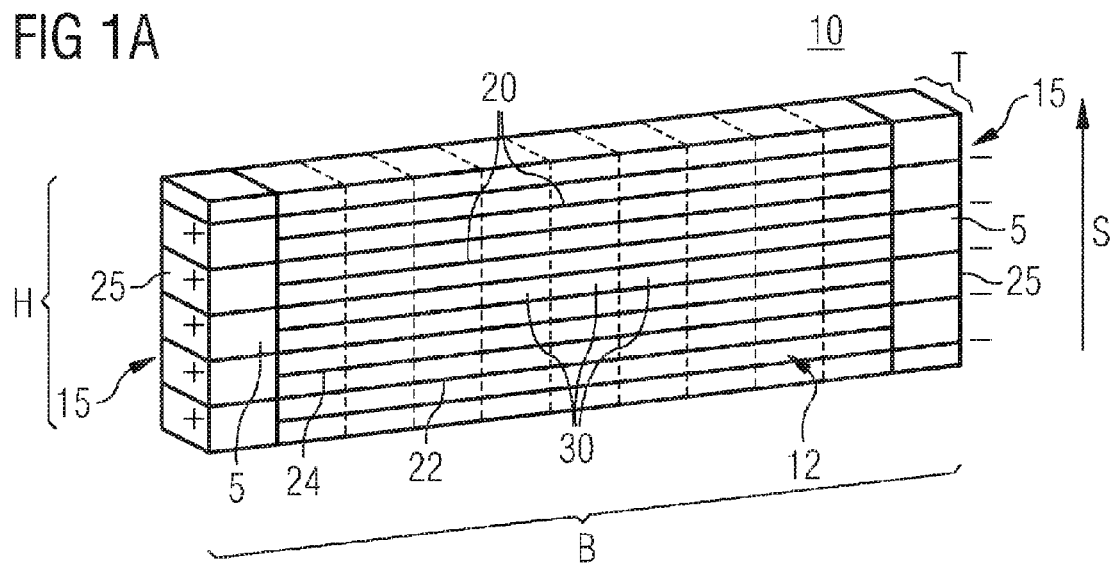
FIG. 1A, B show different embodiment variants of a multilayer bar.

According to a first embodiment, the production method has the following steps: Production of a multilayer bar as a green body consisting of an alternating arrangement of a plurality of piezoceramic layers and a plurality of electrodes in a stacking direction of the multilayer bar, while a depth of the multilayer bar vertically to the stacking direction corresponds to a depth of a multilayer actuator and a width of the multilayer bar vertically to the stacking direction corresponds to a width of a plurality of multilayer actuators, and the electrodes extend over the entire depth of the multilayer bar and in alternation starting at opposite front faces of the multilayer bar over not the full width of the multilayer bar; arrangement of opposite auxiliary electrodes on the front faces spaced apart around the width of the multilayer bar such that every second electrode can be electrically driven with the opposite auxiliary electrodes offset by one electrode in the stacking direction in each case; electrochemically setting back parallel to the depth of the multilayer bar, in particular etching, of a lateral surface of every second electrode such that on opposite wide sides of the multilayer bar every second lateral surface of the electrode in each case is set back into the multilayer bar and the set-back lateral surfaces of the electrodes are spaced apart from one another by one piezoceramic layer on opposite wide sides of the multilayer bar in the stacking direction; coating of the set-back lateral surfaces of the electrodes with an electrically insulating layer and application in each case of a plurality of external electrodes on the opposite wide sides of the multilayer bar parallel to the stacking direction; sintering and separation of the multilayer bar parallel to its depth and stacking direction into a plurality of piezoceramic multilayer actuators.

In order to reduce the cost and effort involved in producing fully active piezoelectric multilayer actuators, the majority of the production steps are performed on a multilayer bar in the green state. Owing to its not yet sintered ceramic structure, said bar can be processed with less effort and consequently at lower cost. Furthermore, the multilayer bar with auxiliary electrodes at its front faces spaced apart around the width offers the possibility of producing a plurality of piezoelectric multilayer actuators simultaneously, whereby at the end of the production method the multilayer bar is separated into individual multilayer actuators.

In order to produce structured electrodes on the exteriors of the multilayer bar, the lateral surfaces of every second electrode are initially set back or, as the case may be, recessed into the multilayer bar by etching. The indentations that form and in which the lateral surfaces of every second electrode are arranged are filled with slip made of a material that is electrically insulating after the burning-out phase. These materials are glass or ceramic, for example. Based on the etching and the following electrical insulation by slip casting, the lateral surfaces of every second electrode that is to be electrically connected are arranged exposed outside the recesses in such a way that they can be electrically interconnected by, for example, the imprinting of an outer metallization.

According to a further embodiment, instead of the above-discussed electrochemical setting-back, electrically conductive material is electrochemically deposited on a lateral surface of every second electrode in each case, such that every second lateral surface of the electrodes in each case projects from the multilayer bar on opposite wide sides of the multilayer bar, the projecting lateral surfaces of the electrodes are spaced apart from one another by one piezoceramic layer on opposite wide sides of the multilayer bar in the stacking direction, and recesses are formed between the projecting lateral surfaces of the electrodes.

In the same way as described above, these recesses are filled with a slip made of material that is electrically insulating following the burning-out. Consequently, only the lateral surfaces of the electrodes of the multilayer bar that are raised as a result of electrochemical deposition are exposed on its wide sides. In the case of this method path, too, the advantages of the simplified processing of a multilayer bar in the green state as well as the simultaneous production of a plurality of multilayer actuators are made use of with the aid of said multilayer bar. It also works to advantageous effect that the lateral surfaces, arranged in recesses, of the electrodes that are to be electrically insulated can be effectively insulated by means of slip. In addition the slip is burned out for example in combination with the sintering of the multilayer bar in order to achieve a further optimization of the production method.

According to a further embodiment of a production method for a piezoceramic multilayer actuator, the following steps are performed: Production of a multilayer bar as a green body consisting of an alternating arrangement of a plurality of piezoceramic layers and a plurality of electrodes in a stacking direction of the multilayer bar, while a depth of the multilayer bar vertically to the stacking direction corresponds to a depth of a multilayer actuator and a width of the multilayer bar vertically to the stacking direction corresponds to a width of a plurality of multilayer actuators, and the electrodes extend over the entire depth and width of the multilayer bar, or production of a piezoelectrically fully active stack consisting of an alternating arrangement of a plurality of piezoceramic layers and a plurality of electrodes in a stacking direction; removal in each case of a lateral surface of every second electrode parallel to the depth direction of the multilayer bar by means of sawing, grinding, lasing, eroding and/or shaping, such that on opposite wide sides of the multilayer bar every second lateral surface of the electrodes in each case is set back into the multilayer bar and the set-back lateral surfaces of the electrodes are spaced apart from one another by one piezoceramic layer on opposite wide sides of the multilayer bar in the stacking direction; coating of the set-back lateral surfaces of the electrodes with an electrically insulating layer and application in each case of a plurality of external electrodes on the opposite wide sides of the multilayer bar parallel to the stacking direction, sintering and separation of the multilayer bar parallel to its depth and stacking direction into a plurality of piezoceramic multilayer actuators.

In order to produce the piezoceramic multilayer actuator, piezoceramic green films are cast initially. The green films are subsequently printed with electrode material which consists, for example, of silver-palladium alloys. These surfaces form the subsequent internal electrodes 20. Furthermore, the printed green films are arranged one on top of another in the stacking direction S to form a stack. Preferably an unprinted green film is arranged between two printed green films in order to reduce the risk of an electric short-circuit in the interior of the subsequent multilayer actuator.

After the green films have been stacked, these are present as a block, i.e. the width and depth of the block are in each case a multiple of the depth and width of a subsequent multilayer actuator. In the green state the block is sufficiently stable in order to be processed chemically, mechanically or in some other way. Moreover, the structure of the block is less resistant than in the sintered state, so processing of the block can be carried out with less effort. The block (not shown) in the green state is split into a plurality of multilayer bars 10, by sawing for example. The multilayer bar 10 as a green body comprises an alternating arrangement of a plurality of piezoceramic layers 30 and a plurality of electrodes 20 in the stacking direction S. A depth T of the multilayer bar 10 vertically to its stacking direction S corresponds to a depth of a multilayer actuator after production and a width B of the multilayer bar 10 vertically to its stacking direction S corresponds to a width of a plurality of multilayer actuators after their production (cf. FIG. 1A, B). The electrodes 20 of the multilayer bar 10 extend over the entire depth T of the multilayer bar 10.

Figure 1B:
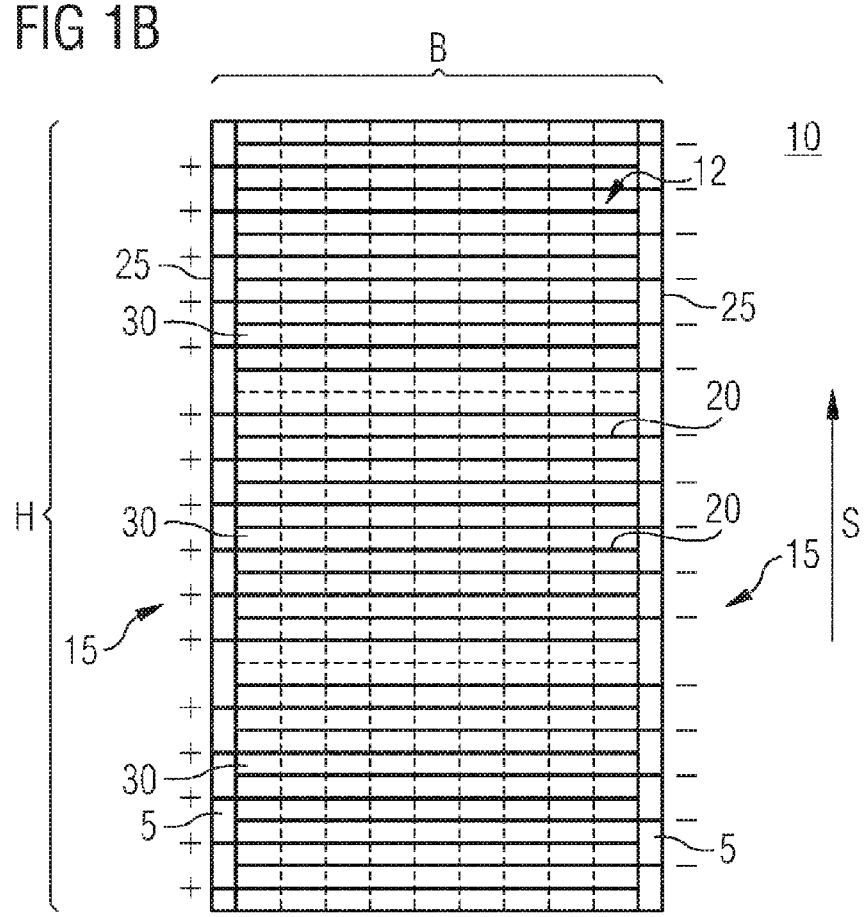

According to one embodiment variant (cf. FIG. 1A), the height H of the multilayer bar 10 corresponds approximately to the height of a subsequent multilayer actuator in the sintered state. After further processing steps and the sintering (see below), the multilayer bar 10 is subdivided by means of separating cuts parallel to its stacking direction S into individual multilayer actuators (cf. the dashed lines in FIG. 1A). According to a further embodiment variant (cf. FIG. 1B), the sintered multilayer bar 10 is split by means of cuts parallel and vertically to its stacking direction S along the dashed lines. Thus, a plurality of multilayer actuators are produced simultaneously with the aid of the multilayer bar 10 in the green state, while in addition a simplified processing in the green state is made use of within the framework of the production method.

The multilayer bar 10 in the green state comprises the already aforementioned piezoceramic layers 30 and electrodes 20, alternating in each case in the stacking direction S. The lateral surfaces 22, 24 of the electrodes 20 in each case extend up to the surface of the wide sides 12 of the multilayer bar 10. The multilayer bar 10 comprises an auxiliary electrode 25 at each of its opposite front faces 15.

Every second electrode 20 starts at an auxiliary electrode 25 and ends before the opposite auxiliary electrode 25. Thus, the electrodes 20 do not extend over the entire width B of the multilayer bar 10. Every second electrode 20 with the lateral surfaces 22 or 24 can therefore be electrically driven jointly based on the use of the auxiliary electrodes 25. Also resulting from this design structure, however, are the piezoelectrically inactive zones 5 adjacent to the front faces 15 of the multilayer bar 10. As far as the production of multilayer actuators is concerned, these zones are to be regarded as lost areas, since they have no further use following completion of the production method.

Once the multilayer bar 10 is present in the green state, i.e. the steps "production of the multilayer bar S1" and "arrangement of auxiliary electrodes S2" have been completed, a wide side 12 is preferably insulated with a passivation layer. After the passivation layer has been applied, the multilayer bar 10 is electrochemically treated in an electrolyte bath (cf. FIG. 2). It is also conceivable to process the multilayer bar without passivation layer. In this case only one wide side 12 of the multilayer bar is immersed in an electrolyte 52 (cf. FIG. 2) in order to process said wide side electrochemically.

Figure 2:
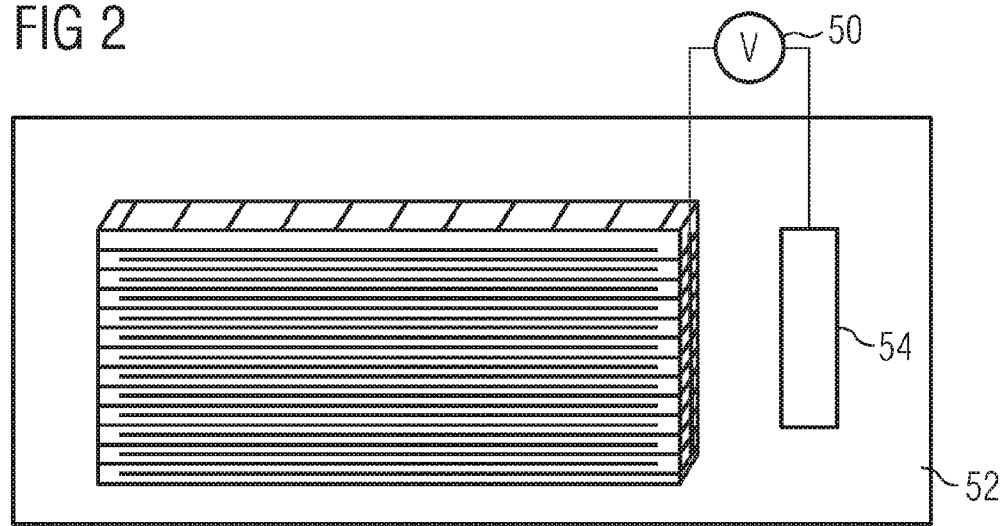
FIG. 2 shows a schematic representation for the electrochemical treatment of a multilayer bar.

The multilayer bar 10 is processed electrochemically with the aid of the electroplating bath shown in FIG. 2, whereby electrically conductive material is deposited on the lateral surfaces 22; 24 of the electrodes 20. Said materials include gold, a silver-palladium compound or other metals and alloys which will withstand a subsequent thermal treatment without damage.

The electroplating bath contains the electrolyte 52 and an electroplating electrode 54 for applying a direct electrical voltage via the voltage source 50 between the electroplating electrode 54 and one of the auxiliary electrodes 25. The direct voltage source 50 is connected to just one of the auxiliary electrodes 25 so that only the lateral surfaces 22 will be coated with electrically conductive material on one wide side 12. During the coating the metal ions from the electrolyte 52 migrate in the electric field in the direction of the electrodes 20 and are deposited there on the lateral surfaces 22. Following the deposition process the passivation layer is removed and applied on the opposite wide side 12 or the opposite wide side 12 is immersed in the electroplating bath. Owing to the fact that the other auxiliary electrode 25 is now connected to the direct voltage source 50, only the lateral surfaces 24 of the electrodes 20 on the opposite wide side 12 are coated with electrically conductive material.

Figure 3:
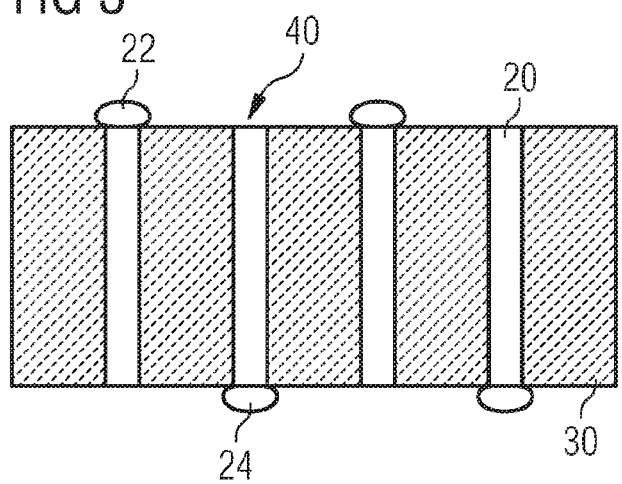
FIG. 3 shows an enlarged section of the multilayer bar following the electrochemical deposition step.

The coated lateral surfaces 22, 24 on the opposite wide sides 12 are therefore spaced apart from one another by one piezoceramic layer 30 in each case, as shown in FIG. 3. The electrochemically deposited electrically conductive material on the lateral surfaces 22 or 24 of the electrodes 20 therefore includes recesses 40, in each of which an electrode 20 is arranged.

According to a further production alternative, a similar recess structure to that shown in FIG. 3 is created by electrolytic etching S4. For that purpose the multilayer bar 10 is immersed with one wide side 12 only or completely with a previously passivated wide side 12 in an etching bath. The etching bath preferably contains typical electrolyte solutions, such as e.g. aqueous sodium chloride solution or sodium nitrate solution. A direct electrical voltage is then applied via only one auxiliary electrode 25 to the electrode 20 with the lateral surfaces 22. Thus, only the lateral surfaces 22 of the electrodes 20 are electrochemically removed. Thereafter, the opposite wide side 12 is immersed in the etching bath and the other auxiliary electrode 25 is electrically driven. As a result the lateral surfaces 24 of the electrodes 20 are eroded. It is also conceivable for the opposite wide side 12 to be provided with a passivation layer and the other auxiliary electrode 25 to be electrically driven. With the aid of this etching method the lateral surfaces 24 are etched away or, as the case may be, set back. A plurality of recesses 40 are again formed on both wide sides 12 between unetched lateral surfaces 22 or 24 of the electrodes 20 in each case. Since the lateral surfaces 22, 24 are smaller in comparison with the piezoceramic lateral surfaces of the layers 30, these can be etched with less effort and consequently set back parallel to the depth direction T into the multilayer bar 10.

Figure 4:
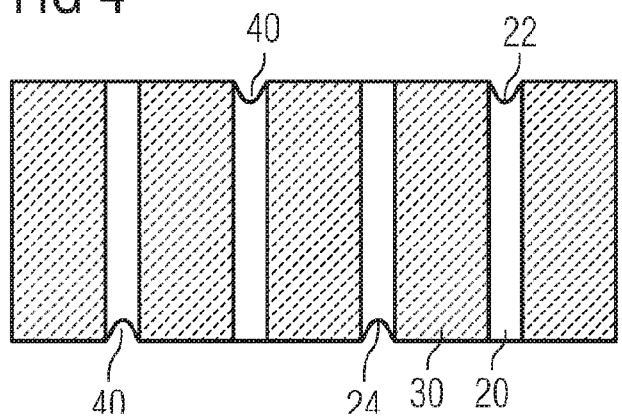
FIG. 4 shows a section of the multilayer bar after the etching process.
Figure 11:
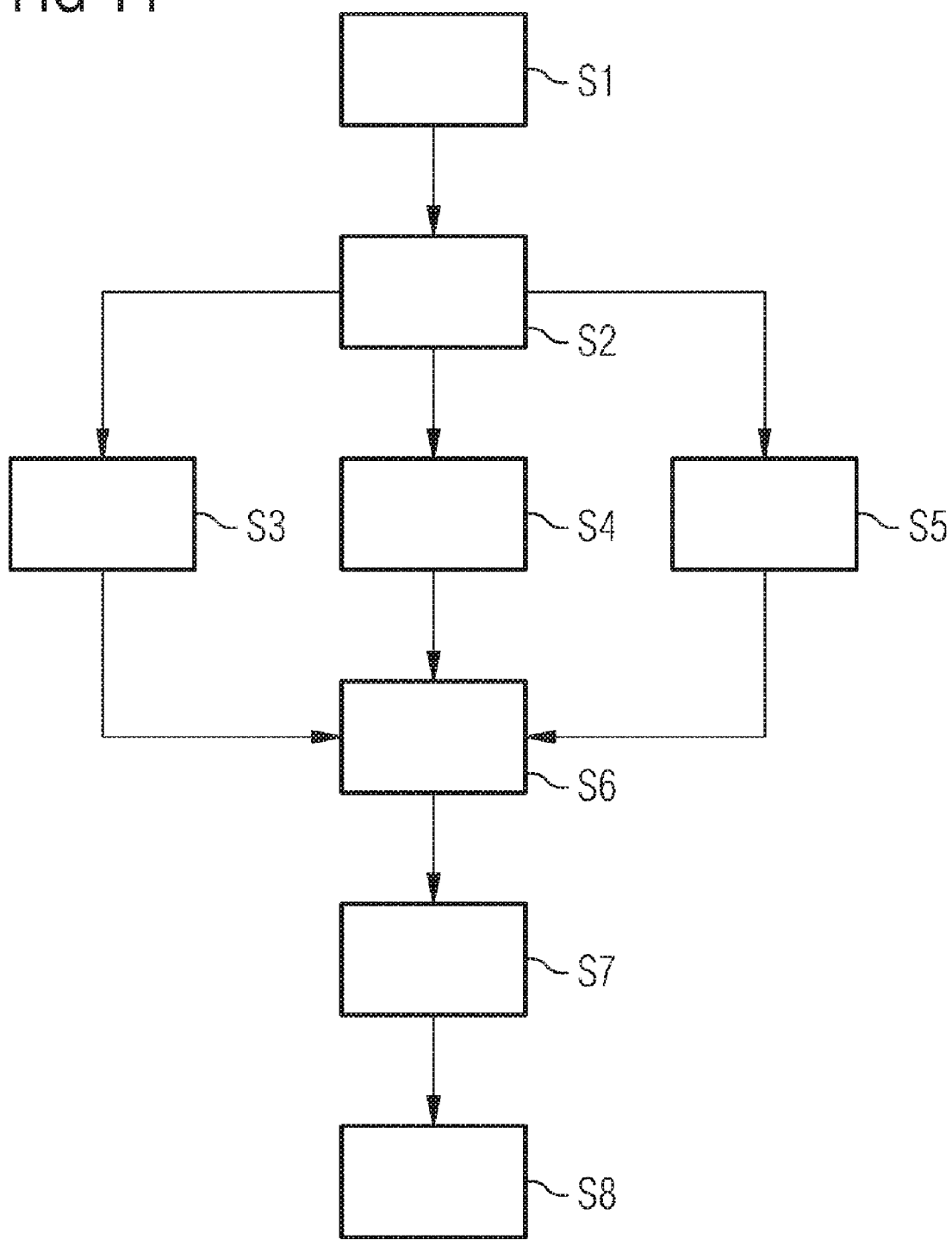
FIG. 11 shows a flowchart for schematically representing different method sequences of the production method.

In order now to insulate every second electrode 20 electrically on the wide sides 12 independently of the preceding production steps so that outer metallizations can be imprinted (step S7 in FIG. 11), the recesses 40 are filled with a slip. The slip fills the recesses 40 (cf. FIGS. 3 and 4) to such an extent that the electrodes 20 arranged in the recesses 40 in each case are covered by a layer (not shown). The slip is preferably based on a ceramic or vitreous powder such that an electrically insulating layer forms in the recesses 40 over the electrodes 20 after the slip has dried. During the sintering S8 of the multilayer bar 10 the slip in the recesses 40 is also hardened with the result that a resistant layer is formed without a separate thermal treatment.

It is also preferred for the multilayer bar 10 to be electrochemically processed only after the sintering, i.e. to deposit conductive materials or etch back lateral surfaces 22; 24 of the electrodes 20 in order to produce the above-described recess structure. Thereafter the recesses 40 are then filled with slip and the latter is hardened by means of an appropriate thermal treatment. The outer metallizations are then applied and the multilayer bar is separated into individual multilayer actuators.

Prior to the sintering S8, outer metallizations are imprinted (S7) in the areas which result in individual multilayer actuators after the splitting of the multilayer bar 10. The outer metallizations are printed for example by means of screen printing or other commonly used methods. Subsequently the multilayer bar 10 with outer metallization is sintered and singulated into individual multilayer actuators along the dashed lines in FIGS. 1A, B. In the course of the singulating the inactive zones 5 are separated off with the adjacent auxiliary electrodes 25. It is preferred to perform the singulating or separation S7 prior to or after the sintering S8. If, for example, the singulating is performed prior to the sintering S8, the structure of the multilayer bar 10 is less hard so the singulating can be performed with less effort.

According to a further production alternative, the above-described recess structure is produced by removal S5 of the lateral surfaces 22; 24 of the electrodes 20 according to FIG. 5 to 10. The production route with said method step S5 requires neither a multilayer bar 10/stack (see below) with auxiliary electrodes 25 and piezoelectrically inactive zones 5 nor a passivation layer. For that reason a simplified processing is possible here in comparison with the previous method routes on a piezoelectrically fully active layer structure.

Figure 5:
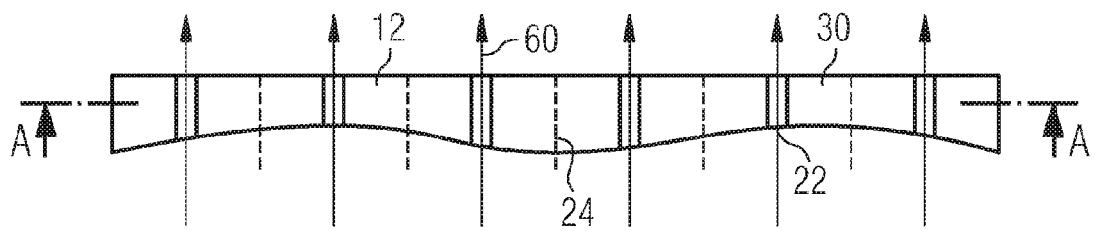
FIG. 5 shows an enlarged section of the multilayer bar to illustrate the removal of material by means of sawing, grinding and similar methods.
Figure 6:
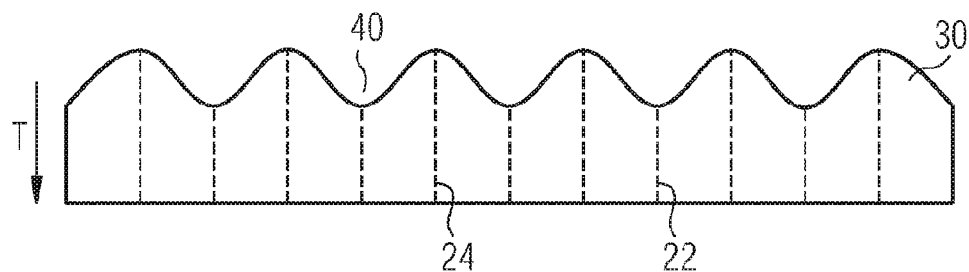
FIG. 6 shows a representation of the section along the line A-A from FIG. 5.

In the multilayer bar 10 in the green state, a section of which is shown in FIG. 5, the electrode surfaces 22 are removed on a wide side 12. The removal is effected by means of grinding, sawing, lasing, eroding and/or shaping in the depth direction T of the multilayer bar 10. According to a first alternative of the removal S5, the lateral surfaces 22 of every second electrode 20 are removed on a wide side 12 parallel to their running direction (cf. FIG. 5, 6). The removal direction 60 is aligned parallel to the lateral surface 22. As a result of said processing the lateral surfaces 22 are set back into the multilayer bar 10 in the depth direction T, such that the recesses 40 are produced. For clarity of illustration FIG. 6 shows a section along the line A-A from FIG. 5.

The above operation is performed on both wide sides 12 of the multilayer bar 10 in order thereafter to insulate the recesses with slip, apply outer metallizations and perform the sintering S8 (see above).

Figure 7:
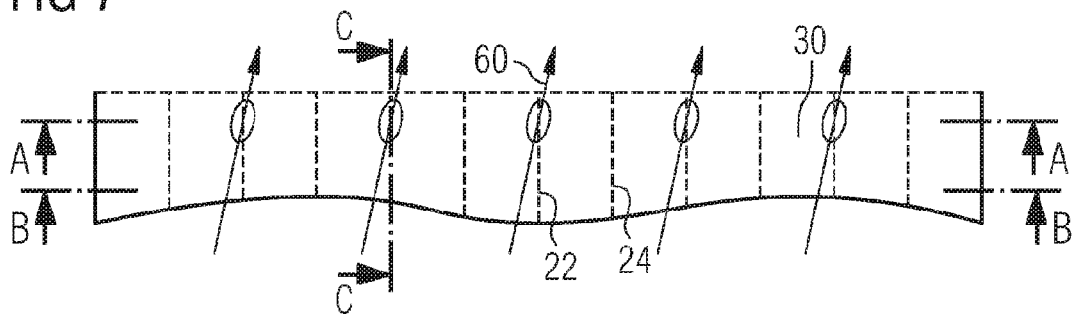
FIG. 7 shows an enlarged section of the multilayer bar to illustrate the removal of material not parallel to the lateral surface of the electrodes.
Figure 8:
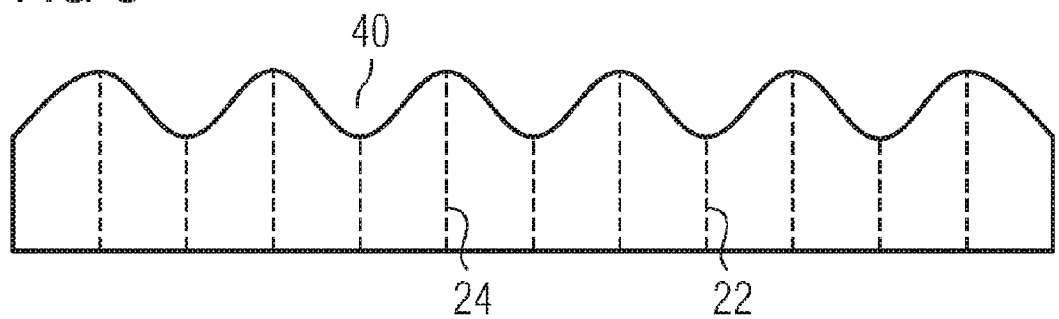
FIG. 8 shows a sectional representation along the line A-A from FIG. 7.
Figure 9:
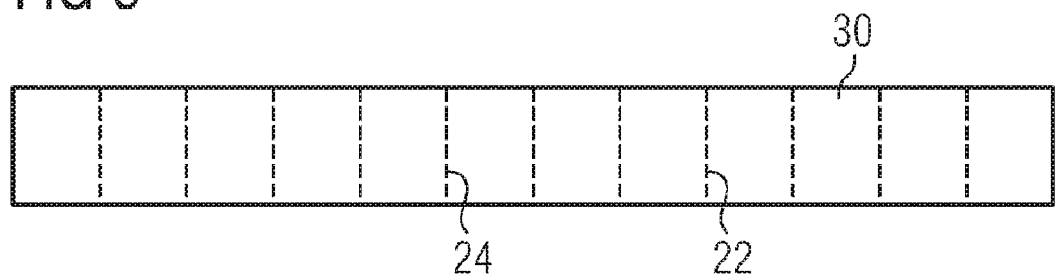
FIG. 9 shows a sectional representation along the line B-B from FIG. 7.
Figure 10:
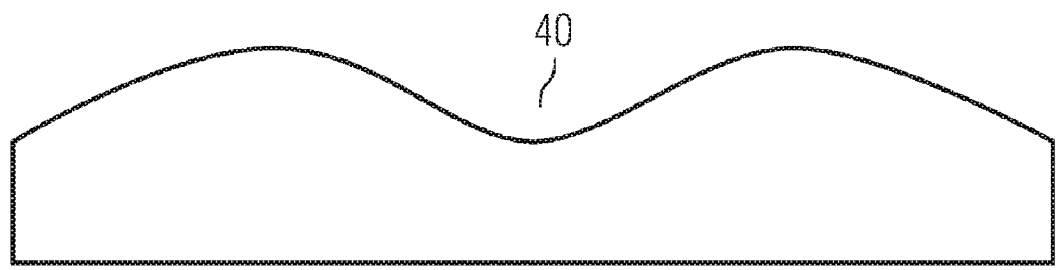
FIG. 10 shows a sectional representation along the line C-C from FIG. 7.

According to a further alternative, the removal direction 60 is not aligned parallel to the running direction of the lateral surfaces 22; 24 of the electrodes 20 (cf. FIG. 7). This opens up the possibility to remove only a subarea of the lateral surfaces 22; 24 in order to reduce the production overhead. If one considers the section along the line A-A in FIG. 7, the recess structure (cf. FIG. 8) as already described is produced once again by the non-parallel removal as well. In this case the recesses 40 are spatially limited to a subarea of the lateral surfaces 22; 24, as is apparent from the sections along the lines B-B and C-C in FIG. 7 (cf. FIG. 9 and 10). With this oblique removal in comparison with the running direction of the lateral surfaces 22; 24 of the electrodes 20, the lateral surfaces 22; 24 are sure to be cut and removed in a subarea. Compared to the parallel removal, this requires less adjustment overhead of the removing machine in order to set back and subsequently insulate every second electrode 20 into the multilayer bar 10 in each case.

After the recess structure has been produced on both wide sides 12 of the multilayer bar 10, the same method steps and method alternatives are performed as already described above.

It is also conceivable to sinter the multilayer bar 10 first and only then to produce the recess structure by removal (see above). Subsequently, the lateral surfaces 22; 24 of the electrodes 20 arranged in the recesses 40 are electrically insulated in each case using slip and the slip is hardened by thermal treatment.

According to a further alternative, the removal is performed not on a multilayer bar, but already on a stack (not shown) of the subsequent multilayer actuator. If the stack is present in the green state, the thermal treatment of the slip in the recess structure produced by removal is linked to the sintering of the stack. If the stack is present in the sintered state, a thermal treatment is carried out after the removal and application of the slip in the recess structure in order to harden the slip.

What is claimed is:

1. A production method for a piezoceramic multilayer actuator, which method has the following steps:
a) Production of a multilayer bar as a green body consisting of an alternating arrangement of a plurality of piezoceramic layers and a plurality of electrodes in a stacking direction of the multilayer bar, while a depth of the multilayer bar vertically to the stacking direction corresponds to a depth of a multilayer actuator and a width of the multilayer bar vertically to the stacking direction corresponds to a width of a plurality of multilayer actuators and the electrodes extend over the entire depth of the multilayer bar and in alternation starting at opposite front faces of the multilayer bar over not the full width of the multilayer bar, b) arrangement of opposite auxiliary electrodes on the front faces spaced apart around the width of the multilayer bar such that every second electrode can be electrically driven in each case with the opposite auxiliary electrodes offset by one electrode in the stacking direction, c) electrochemical setting-back parallel to the depth of the multilayer bar of a lateral surface of every second electrode such that on opposite wide sides of the multilayer bar every second lateral surface of the electrodes in each case is set back into the multilayer bar and the set-back lateral surfaces of the electrodes are spaced apart from one another by one piezoceramic layer on opposite wide sides of the multilayer bar in the stacking direction, d) coating of the set-back lateral surfaces of the electrodes with an electrically insulating layer and application in each case of a plurality of external electrodes on the opposite wide sides of the multilayer bar parallel to the stacking direction, e) sintering and separation of the multilayer bar parallel to its depth and stacking direction into a plurality of piezoceramic multilayer actuators, wherein the set-back lateral surfaces of the electrodes are in each case arranged in a recess which are filled and burned out for coating with an electrically insulating layer made of a ceramic or vitreous slip casting.

2. The production method according to claim 1, wherein the plurality of external electrodes are imprinted on the opposite wide sides of the multilayer bar.

3. The production method according to claim 1, wherein the front faces with the auxiliary electrodes arc split off in such a way that no piezoelectrically inactive zones remain in the multilayer bar.

4. The production method according to claim 1 wherein the sintering is performed after steps c) and d).

5. A piezoceramic multilayer actuator which is produced using a production method according to claim 1.

6. The production method according to claim 1, wherein the step of electrochemical setting-back parallel to the depth of the multilayer bar is performed by etching.

* * * * *